US012341504B2

(12) United States Patent
Sadati et al.

(10) Patent No.: US 12,341,504 B2
(45) Date of Patent: Jun. 24, 2025

(54) PRE-CONDITIONING A NODE OF A CIRCUIT

(71) Applicant: Cirrus Logic International Semiconductor Ltd., Edinburgh (GB)

(72) Inventors: Hamed Sadati, Swindon (GB); John A. Breslin, Glasgow (GB); Sushanth Hegde, Edinburgh (GB); John L. Melanson, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 0 days.

(21) Appl. No.: 18/428,442

(22) Filed: Jan. 31, 2024

(65) Prior Publication Data
US 2024/0380396 A1   Nov. 14, 2024

Related U.S. Application Data

(63) Continuation of application No. 17/356,606, filed on Jun. 24, 2021, now Pat. No. 11,936,373.

(51) Int. Cl.
*H03K 17/30* (2006.01)
*H03K 17/042* (2006.01)
*H03K 17/06* (2006.01)

(52) U.S. Cl.
CPC ..... *H03K 17/302* (2013.01); *H03K 17/04206* (2013.01); *H03K 17/063* (2013.01)

(58) Field of Classification Search
CPC .......... H03K 17/302; H03K 17/04206; H03K 17/063
See application file for complete search history.

(56) References Cited

U.S. PATENT DOCUMENTS

| | | | |
|---|---|---|---|
| 4,698,743 A | 10/1987 | Onodera et al. | |
| 9,740,221 B2 | 8/2017 | Cavallini et al. | |
| 11,082,047 B2 | 8/2021 | Zhan et al. | |
| 11,086,343 B2 | 8/2021 | Kim | |
| 11,625,055 B2 | 4/2023 | Azevedo et al. | |
| 2005/0035749 A1 | 2/2005 | Bo et al. | |
| 2019/0025861 A1 | 1/2019 | Hung et al. | |
| 2020/0052595 A1 | 2/2020 | Oak et al. | |

OTHER PUBLICATIONS

International Search Report and Written Opinion of the International Searching Authority, International Application No. PCT/GB2022/050771, mailed Jun. 29, 2022.

*Primary Examiner* — Menatoallah Youssef
*Assistant Examiner* — Colleen J O Toole
(74) *Attorney, Agent, or Firm* — Jackson Walker L.L.P.

(57) ABSTRACT

Pre-conditioning circuitry for pre-conditioning a node of a circuit to support a change in operation of the circuit, wherein the circuit is operative to change a state of the node to effect the change in operation of the circuit, and wherein the pre-conditioning circuitry is configured to apply a voltage, current or charge directly to the node to reduce the magnitude of the change to the state of the node required by the circuit to achieve the change in operation of the circuit.

11 Claims, 5 Drawing Sheets

PRE-CONDITIONING A NODE OF A CIRCUIT

The present disclosure is a continuation of U.S. Non-provisional patent application Ser. No. 17/356,606, filed Jun. 24, 2021, which is incorporated by reference herein in its entirety.

FIELD OF THE INVENTION

The present disclosure relates to circuitry for pre-conditioning a node of a circuit.

BACKGROUND

Electronic circuitry is commonly used in applications in which a rapid transition between operating states must be supported. For example, circuitry may be required to support a rapid transition between an inactive (e.g. off) state and an active state, or a rapid transition between a low-power mode of operation and a higher-power mode.

The time taken by circuitry to transition from one operating state to another is limited by the bandwidth of the circuitry. Instantaneous transitions between states cannot be achieved due to the finite bandwidth of circuitry. The bandwidth of an electronic circuit may be limited by factors such as capacitances within the circuitry (both intentional capacitances arising from the use of capacitors in the circuit and unintentional parasitic capacitances arising, for example, from the components used in the circuit and their layout within the circuit).

In many applications there is a desire to reduce the time required to transition between operating states.

SUMMARY

According to a first aspect, the invention provides pre-conditioning circuitry for pre-conditioning a node of a circuit to support a change in operation of the circuit, wherein the circuit is operative to change a state of the node to effect the change in operation of the circuit, and wherein the pre-conditioning circuitry is configured to apply a voltage, current or charge directly to the node to reduce the magnitude of the change to the state of the node required by the circuit to achieve the change in operation of the circuit.

The change in operation of the circuit may be in response to: start-up of the circuit; a transient in a supply voltage to the circuit; a change in the supply voltage to the circuit, a transient in a load of the circuit; a change in the load of the circuit.

The pre-conditioning circuitry may comprise:
monitor circuitry configured to monitor a voltage of the circuitry; and
control circuitry configured to apply the voltage, current or charge to the node based on a characteristic of the monitored voltage.

The characteristic may comprise a magnitude or rate of change of the monitored voltage.

The voltage may comprise a supply voltage or an output voltage of the circuit.

The circuit may comprise a low dropout regulator circuit.

The node may be coupled to a control node of an output device of the circuit.

The node may comprise an output node of the circuit.

The node may be coupled to a capacitor of the circuit.

The capacitor may be a miller capacitor, for example.

The voltage, current or charge applied to the node may be equal to or close to a voltage, current or charge that would otherwise be applied to the node by the circuit to achieve the change in operation of the circuit.

The node may be associated with a capacitance, and the voltage, current or charge applied to the node is configured to compensate for the effect of the capacitance.

The capacitance may be a parasitic capacitance.

The pre-conditioning circuitry may be configured to apply the voltage, current or charge to the node in response to detection of a trigger condition that will trigger the change in operation of the circuit.

The pre-conditioning circuitry accordingly may further comprise look-ahead circuitry configured to detect the trigger condition.

According to a second aspect, the invention provides an integrated circuit comprising the circuitry of the first aspect.

According to a third aspect, there is provided a device comprising the circuitry of the first aspect.

The device may comprise a portable device, a battery powered device, a mobile telephone, a tablet or laptop computer, a smart speaker, an accessory device, a headset device, smart glasses, headphones, earphones or earbuds.

BRIEF DESCRIPTION OF THE DRAWINGS

Embodiments of the invention will now be described, strictly by way of example only, with reference to the accompanying drawings, of which.

DETAILED DESCRIPTION

Figure 1:
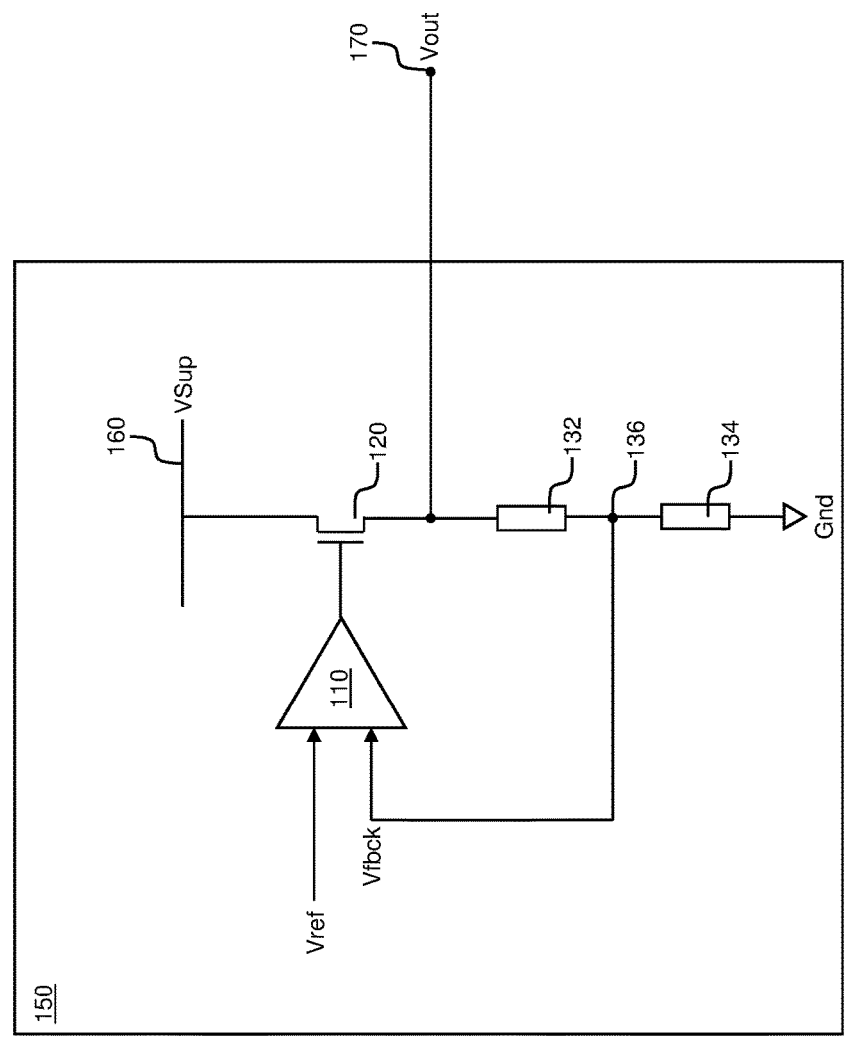
FIG. 1 is a schematic diagram illustrating typical low dropout regulator (LDO) circuitry.

FIG. 1 is a schematic representation of typical LDO circuitry. As shown, the LDO circuitry (shown generally at 100) comprises differential amplifier circuitry 110, an output device 120, and a voltage divider comprising first and second series-connected resistances 132, 134. The differential amplifier circuitry 110, output device 120 and series-connected resistances 132, 134 may be integrated into a single integrated circuit (IC) device 150.

An output terminal of the differential amplifier circuitry 110 is coupled to a control terminal (e.g. a gate terminal) of the output device 120 (which may be, for example, a MOSFET device), so as to provide a bias voltage to the output device 120. A first terminal (e.g. a drain terminal) of the output device 120 is coupled to a supply voltage rail 160 which provides a supply voltage Vsup. The first and second resistances 132, 134 are coupled in series between a second terminal (e.g. a source terminal) of the output device 120 and a reference voltage supply, which in the illustrated example is ground.

An output terminal 170 of the circuitry 100 is coupled to the second terminal of the output device 120. Load circuitry (not shown) can be coupled to the output terminal 170 so as to receive the regulated voltage supply Vout.

In the example shown in FIG. 1, the second input terminal of the amplifier circuitry 110 is coupled to a node 136 intermediate the first and second resistances 132, 134, and thus receives a portion of the regulated voltage supply Vout as a feedback voltage Vfbck. In an alternative arrangement in which the amplifier circuitry 110 is configured as a voltage buffer (as opposed to the voltage scaler arrangement shown in FIG. 1) the second input terminal of the amplifier circuitry 110 may be coupled directly to the second terminal of the output device 120, such that the second input terminal of the amplifier circuitry 110 receives the regulated voltage supply Vout as the feedback voltage Vfbck. In either case, the feedback arrangement acts to minimise any difference between the reference voltage Vref and the feedback voltage Vfbck, by causing the amplifier circuitry 110 to adjust its output voltage which, as discussed above, is received by the control terminal of the output device 120 as its bias voltage. As will be appreciated by those of ordinary skill in the art, adjusting the bias voltage to the control terminal of the output device 120 changes the voltage across the first and second terminals (e.g. the drain-source voltage) of the output device 120, and therefore changes the regulated voltage supply Vout and hence the feedback voltage Vfbck. Thus, by minimising the difference between Vfbck and Vref, the amplifier circuitry 110 is operative to maintain the regulated output voltage Vout within a specified output voltage range.

The supply voltage Vsup may be provided by a battery of a host device that incorporates the LDO circuitry 100. The magnitude of the supply voltage Vsup may change. For example, on start-up of the LDO circuitry 100 the magnitude of the supply voltage Vsup increases, over a relatively short period of time, to a nominal battery voltage. The magnitude of the supply voltage Vsup may also decrease, e.g. as a result of discharge of the battery through use or over time, or may decrease or increase as a result of changing loads on the battery, for example as other circuitry (e.g. sensor or actuator circuitry) of the host device that receives power from the battery is switched on or off.

Such changes in the supply voltage Vsup may cause a temporary change in the output voltage Vout of the LDO circuitry 100 while the amplifier circuitry 110 acts to adjust the bias voltage to the control terminal of the output device 120 to compensate for the change in the supply voltage Vsup so as to maintain the regulated output voltage Vout within the specified output voltage range.

Additionally, a change in the load at the output terminal 170 of the LDO circuitry 100 can cause a temporary change in the output voltage Vout. For example, when a load is first coupled to the output terminal 170, the resulting inrush current to the load can cause a temporary drop in the output voltage Vout while the amplifier circuitry 110 acts to adjust the bias voltage to the control terminal of the output device 120 to compensate for the change in load current so as to maintain the regulated output voltage Vout within the specified output voltage range.

The LDO circuitry 100 is configured to maintain the regulated output voltage Vout within the specified voltage range despite changes in the magnitude of the supply voltage Vsup or changes in the load applied to the output terminal 170. The LDO circuitry 100 thus responds to any such change in the magnitude of the supply voltage or the load applied to restore the regulated output voltage Vout to a level within the specified voltage range.

However, because of its finite bandwidth (which may be due, at least in part, to capacitance within the LDO circuitry 100), the LDO circuitry 100 cannot react instantaneously to such changes in the magnitude of the supply voltage Vsup. Thus, there will always be a delay between a change in the magnitude of the supply voltage Vsup and the return of the output voltage Vout to a level within the specified voltage range.

In some applications there may be a requirement for the LDO circuitry 100 to support rapid changes between operating modes, e.g. by responding quickly to a change in supply voltage or load or to a transient voltage or current to set or restore the output voltage Vout to a desired operating value within the specified output voltage range within a specified maximum time period. However, because the speed with which the LDO circuitry 100 can respond to such changes is limited by the finite bandwidth of the LDO circuitry 100, it may be desirable to implement measures to reduce the response time of the LDO circuitry 100.

Figure 2:
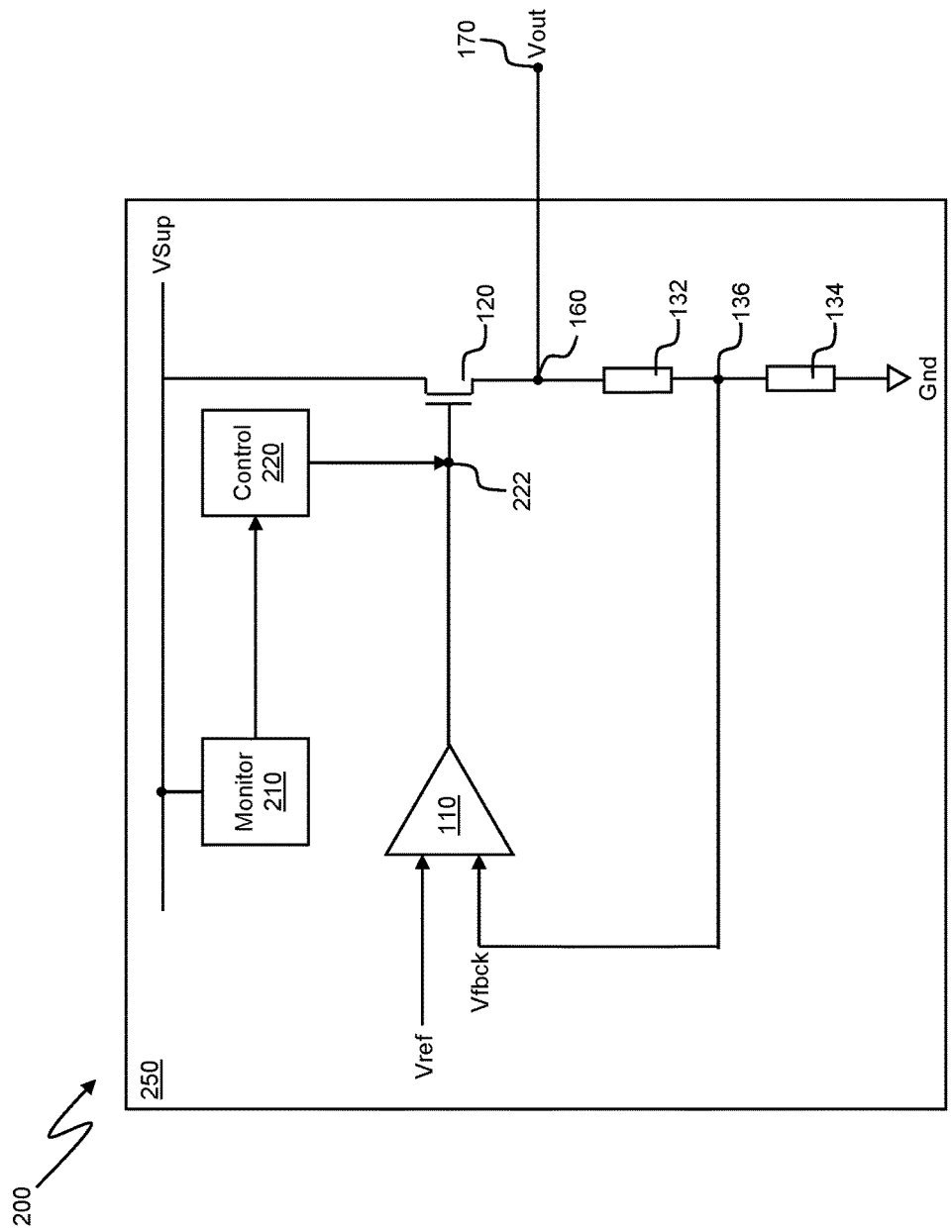
FIG. 2 is a schematic diagram illustrating low dropout regulator (LDO) circuitry including circuitry for pre-conditioning a node of the LDO circuitry.

FIG. 2 is a schematic diagram illustrating low dropout regulator (LDO) circuitry including circuitry for pre-conditioning a node of the LDO circuitry to reduce the response time of the LDO circuitry.

The LDO circuitry (shown generally at 200 in FIG. 2) has a number of features in common with, and operates in a similar manner to, the LDO circuitry 100 of FIG. 1. Such common features are denoted by common reference numerals in FIGS. 1 and 2, and will not be described again in detail here.

The LDO circuitry 200 of FIG. 2 differs from the LDO circuitry 100 of FIG. 1 in that it includes voltage monitor circuitry 210 configured to monitor the supply voltage Vsup, and control circuitry 220 configured to pre-condition a node 222 of the LDO circuitry 200 based on a characteristic such as a magnitude of the supply voltage Vsup or a rate of change of the supply voltage, i.e. dVsup/dt. The monitor circuitry 210 and the control circuitry 220 may together be regarded as pre-conditioning circuitry. The amplifier circuitry 110, output device 120, resistors 132, 134, monitor circuitry 210 and control circuitry 220 may be integrated in a single integrated circuit 250.

In the example illustrated in FIG. 2, the node 222 is coupled to the control terminal (e.g. a gate terminal) of the output device 120, and the control circuitry 220 is configured to apply a voltage directly to the node 222, based on the characteristic of the supply voltage Vsup, to pre-condition the node 222 in advance of a change in operation of the LDO circuitry 200. Pre-conditioning the node 222 by applying a voltage directly to it reduces the magnitude of a change in the voltage at the node that is required to support the change in operation of the LDO circuitry 200 (without necessarily bringing the node 222 to the final voltage required to support the change in operation of the LDO circuitry 200), and thus reduces the time taken by the LDO circuitry 200 to implement the change in operation.

On start-up of the LDO circuitry 200, the supply voltage Vsup increases from 0 v to an operating value (which may be equal to or close to a nominal output voltage of a battery that provides the supply voltage, for example) over a period of time. Without any intervention by the monitor circuitry 210 and the control circuitry 220, the output voltage Vout of the LDO circuitry 200 would also increase from 0 v to its own operating value (i.e. a value within the specified output voltage range). Typically the output voltage Vout of the LDO circuitry 200 only achieves its operating value after a delay caused by the time taken for the supply voltage Vsup to reach its operating value and the response time of the LDO circuitry 200.

It may be desirable, however, for the output voltage Vout of the LDO circuitry 200 to settle at its operating value more quickly. Reducing the settling time of output voltage Vout of the LDO circuitry 200 may support a fast transition from an inactive state to an active state of operation of the LDO circuitry 200.

Thus, in operation of the LDO circuitry 200, the control circuitry 220 may be operative to apply a voltage to the node 222, based on a characteristic of the supply voltage Vsup (as determined by the monitor circuitry 210), to pre-condition the control terminal of the output device 120, in order to reduce the settling time of the output voltage Vout.

The monitor circuitry 210 in this example is configured to monitor the magnitude of the supply voltage Vsup, and to output a monitor output signal to the control circuitry 220 while the magnitude of the supply voltage Vsup is below a predefined threshold value.

The control circuitry 220 is configured to output a voltage to the node 222, in response to the monitor output signal, to increase the bias voltage at the control terminal of the output device 120, thereby increasing the output voltage Vout of the LDO circuitry 200. By pre-conditioning the node 222 by directly applying a voltage to the node 222 to increase the bias voltage in this way, the output voltage Vout reaches its operating value more quickly than would otherwise be the case.

When the magnitude of the supply voltage Vsup reaches the predefined threshold, the monitor circuitry 210 stops outputting the monitor output signal and the control circuitry 220 stops outputting the voltage to the node 222. The LDO circuitry 200 subsequently regulates the output voltage Vout as normal, without any intervention from the monitor circuitry 210 or the control circuitry 220. The predefined threshold may be selected, for example, based on an expected rate of increase of the supply voltage Vsup, such that the predefined threshold is reached after the output voltage Vout has settled at its operating value as a result of the pre-conditioning of the node 222 by the control circuitry 220, to ensure that pre-conditioning of the node 222 continues until the output voltage Vout has settled at its operating value.

During subsequent operation of the LDO circuitry 200 (i.e. after start-up, when the output voltage Vout has settled to its operating value), a reduction in the magnitude of the supply voltage Vsup (which may arise, for example, as a result of other circuitry of a host device that incorporates the LDO circuitry 200 being switched on) may cause a reduction in the output voltage Vout, which will necessitate a compensating increase in the bias voltage applied to the control terminal of the output device 120 in order to maintain the output voltage Vout at its operating value.

Without intervention by the monitor circuitry 210 and the control circuitry 220, the feedback arrangement of the LDO circuitry 200 would cause the voltage output by the amplifier circuitry 110 to increase, thereby providing the required compensating increase in the bias voltage at the control terminal of the output device 120.

However, as will be appreciated from the discussion above, the minimum response time of the LDO circuitry 200 to the change in the supply voltage Vsup in this way is limited by the bandwidth of the LDO circuitry 200, and it may be desirable for the LDO circuitry 200 to respond more quickly than the minimum response time.

Thus, in operation of the LDO circuitry 200, the control circuitry 220 may be operative to apply a voltage to the node 222, based on a characteristic of the supply voltage Vsup (as determined by the monitor circuitry 210), to pre-condition the control terminal of the output device 120 in order to reduce the response time of LDO circuitry 200 to a reduction in the supply voltage Vsup.

The monitor circuitry 210 in this example is configured to monitor the magnitude of the supply voltage Vsup, and to output a monitor output signal to the control circuitry 220 when the magnitude of the supply voltage Vsup falls by a predefined amount. The control circuitry 220 is configured to output a voltage to the node 222, in response to the monitor output signal, to increase the bias voltage at the control terminal of the output device 120, thus reducing the magnitude of an increase in the bias voltage required from the output of the amplifier circuitry 110 in order to restore the output voltage Vout to its operating value following the reduction in the magnitude of the supply voltage Vsup.

In some examples the voltage applied to the node 222 by the control circuitry 220 may be equal to the change in the bias voltage required to restore the output voltage Vout to its operating value after the reduction in the magnitude of the supply voltage Vsup. In other examples the voltage applied to the node 222 may be less than, but close to, the change in the bias voltage required to restore the output voltage Vout to its operating value after the reduction in the magnitude of the supply voltage Vsup.

Pre-conditioning the control terminal of the output device 120 by directly applying a voltage to increase the bias voltage in this way thus reduces the response time of the LDO circuitry 200 to the change in the supply voltage Vsup (i.e. the time taken for the output voltage Vout of the LDO circuitry 200 to return to its operating value following the change in the magnitude of the supply voltage Vsup), because the delay caused by the finite loop bandwidth of the feedback loop between the node 136 and the second input terminal of the amplifier circuitry 110 can be avoided or reduced, since directly raising the bias voltage at the control node of the output device 120 has the effect of reducing the difference between Vref and Vfbck.

Similarly, an increase in the magnitude of the supply voltage Vsup (which may arise, for example, as a result of other circuitry of a host device that incorporates the LDO circuitry 200 being switched off) during operation of the LDO circuitry 200 may cause an increase in the output voltage Vout, which will necessitate a compensating reduction in the bias voltage applied to the control terminal of the output device 120 in order to maintain the output voltage Vout at its operating value.

Without intervention by the monitor circuitry 210 and the control circuitry 220, the feedback arrangement of the LDO circuitry 200 would cause the voltage output by the amplifier circuitry 110 to decrease, thereby providing the required compensating reduction in the bias voltage at the control terminal of the output device 120.

However, as will be appreciated from the discussion above, the minimum response time of the LDO circuitry 200 to the change in the supply voltage Vsup in this way is limited by the bandwidth of the LDO circuitry 200, and it may be desirable for the LDO circuitry 200 to respond more quickly than the minimum response time.

Thus, in operation of the LDO circuitry 200, the control circuitry 220 may be operative to apply a negative voltage to the node 222, based on a characteristic of the supply voltage Vsup (as determined by the monitor circuitry 210), to pre-condition the control terminal of the output device 120 in order to reduce the response time of LDO circuitry 200 to an increase in the supply voltage Vsup.

The monitor circuitry 210 in this example is configured to monitor the magnitude of the supply voltage Vsup, and to output a monitor output signal to the control circuitry 220 when the magnitude of the supply voltage Vsup increases by a predefined amount. The control circuitry 220 is configured to output a voltage to the node 222, in response to the monitor output signal, to reduce the bias voltage at the control terminal of the output device 120, thus reducing the magnitude of a reduction in the bias voltage required from the output of the amplifier circuitry 110 in order to restore the output voltage Vout to its operating value following the increase in the magnitude of the supply voltage Vsup.

In some examples the negative voltage applied to the node 222 by the control circuitry 220 may be equal to the change in the bias voltage required to restore the output voltage Vout to its operating value after the increase in the magnitude of the supply voltage Vsup. In other examples the negative voltage applied to the node 222 may be less than, but close to, the change in the bias voltage required to restore the output voltage Vout to its operating value after the increase in the magnitude of the supply voltage Vsup.

Pre-conditioning the control terminal of the output device 120 by directly applying a voltage to reduce the bias voltage in this way thus reduces the response time of the LDO circuitry 200 to the change in the supply voltage Vsup (i.e. the time taken for the output voltage Vout of the LDO circuitry 200 to return to its operating value following the change in the magnitude of the supply voltage Vsup), because the delay caused by the finite loop bandwidth of the feedback loop between the node 136 and the second input terminal of the amplifier circuitry 110 can be avoided or reduced, since directly reducing the bias voltage at the control node of the output device 120 has the effect of reducing the difference between Vref and Vfbck.

Further, during operation of the LDO circuitry there may be fast transients (which may be positive or negative) in the supply voltage Vsup. Without intervention by the monitor circuitry 210 and the control circuitry 220, the response of the LDO circuitry 200 to such transients, by providing a compensating adjustment to the bias voltage at the control terminal of the output device 120 to maintain the output voltage Vout at its operating value, may not be fast enough.

Thus, the monitor circuitry 210 may be configured to monitor a rate of change of the supply voltage Vsup (i.e. dVsup/dt) and to output a monitor output signal to the control circuitry 220 if the rate of change of the supply voltage Vsup meets a predetermined threshold. In response to the monitor output signal the control circuitry 220 applies a voltage to the node 222 to pre-condition the control terminal of the output device 120 by adjusting (increasing or decreasing as necessary) the bias voltage at the control node so as to compensate for the transient in the supply voltage Vsup.

As in the examples discussed above, pre-conditioning the control terminal of the output device 120 by directly applying a voltage to adjust the bias voltage in this way reduces the response time of the LDO circuitry 200 to the transient in the supply voltage Vsup (i.e. the time taken for the output voltage Vout of the LDO circuitry 200 to return to its operating value following the supply voltage transient), because the delay caused by the finite loop bandwidth of the feedback loop between the node 136 and the second input terminal of the amplifier circuitry 110 can be avoided or reduced, since directly reducing the bias voltage at the control node of the output device 120 has the effect of reducing the difference between Vref and Vfbck.

Figure 3:
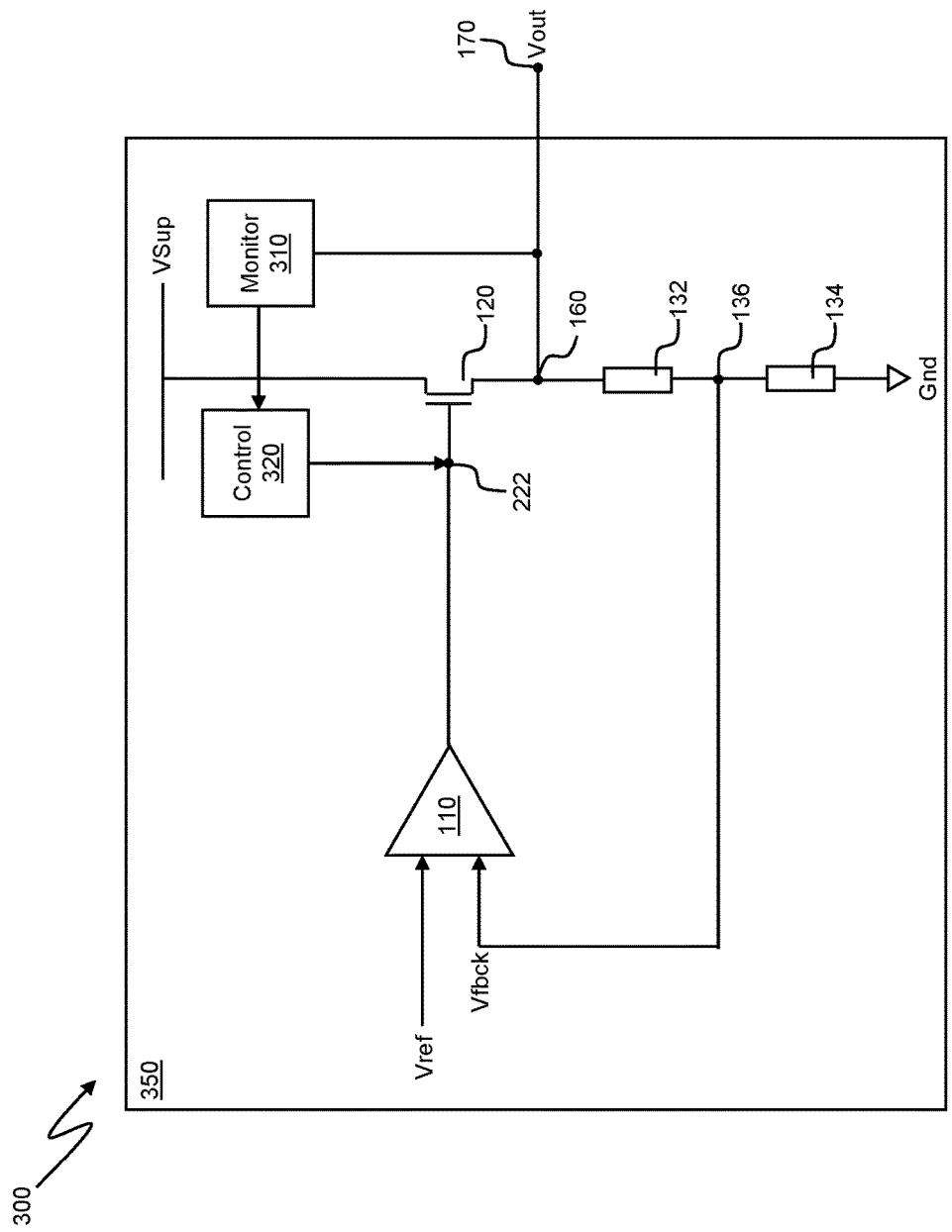
FIG. 3 is a schematic diagram illustrating low dropout regulator (LDO) circuitry including alternative circuitry for pre-conditioning a node of the LDO circuitry.

FIG. 3 is a schematic diagram illustrating low dropout regulator (LDO) circuitry including alternative circuitry for pre-conditioning a node of the LDO circuitry to reduce the response time of the LDO circuitry.

The LDO circuitry (shown generally at 300 in FIG. 3) has a number of features in common with, and operates in a similar manner to, the LDO circuitry 100 of FIG. 1. Such common features are denoted by common reference numerals in FIGS. 1 and 3, and will not be described again in detail here.

The LDO circuitry 300 of FIG. 3 differs from the LDO circuitry 100 of FIG. 1 in that it includes voltage monitor circuitry 310 configured to monitor the output voltage LDO circuitry 300, and control circuitry 320 configured to pre-condition a node 322 of the LDO circuitry 200 based on a characteristic such as a magnitude of the supply voltage Vsup or a rate of change of the supply voltage, i.e. dVsup/dt. The monitor circuitry 310 and the control circuitry 320 may together be regarded as pre-conditioning circuitry. The amplifier circuitry 110, output device 120, resistors 132, 134, monitor circuitry 310 and control circuitry 320 may be integrated in a single integrated circuit 350.

In the example illustrated in FIG. 3, the node 322 is coupled to the control terminal (e.g. a gate terminal) of the output device 120, and the control circuitry 320 is configured to apply a voltage directly to the node 322, based on the characteristic of the output voltage Vout, to pre-condition the node 322 in advance of a change in operation of the LDO circuitry 300.

As in the LDO circuitry 200, on start-up of the LDO circuitry 300, the supply voltage Vsup increases from 0 v to an operating value (which may be equal to or close to a nominal output voltage of a battery that provides the supply voltage, for example) over a period of time, and it may be desirable for the output voltage Vout of the LDO circuitry 300 to settle at its own operating value more quickly than would be the case without any intervention by the monitor circuitry 310 and the control circuitry 320.

Thus, in operation of the LDO circuitry 300, the control circuitry 320 may be operative to apply a voltage to the node 322, based on a characteristic of the output voltage Vout (as determined by the monitor circuitry 310), to pre-condition the control terminal of the output device 120 to reduce the settling time of the output voltage Vout. Pre-conditioning the node 322 by applying a voltage directly to it reduces the magnitude of a change in the voltage at the node that is required to support the change in operation of the LDO circuitry 300 (without necessarily bringing the node 322 to the final voltage required to support the change in operation of the LDO circuitry 300), and thus reduces the time taken by the LDO circuitry 300 to implement the change in operation The monitor circuitry 310 in this example is configured to monitor the magnitude of the output voltage Vout, and to output a monitor output signal to the control circuitry 320 when the magnitude of the output voltage Vout is below a predefined threshold value. The control circuitry 320 is configured to output a voltage to the node 322, in response to the monitor output signal, to increase the bias voltage at the control terminal of the output device 120, thereby increasing the output voltage Vout of the LDO circuitry 300. By pre-conditioning the node 322 in this way, the output voltage Vout reaches its operating value more quickly than would otherwise be the case.

When the magnitude of the output voltage Vout reaches the predefined threshold, the monitor circuitry 310 stops outputting the monitor output signal and the control circuitry 320 stops outputting the voltage to the node 322. The LDO circuitry 300 subsequently regulates the output voltage Vout as normal, without any intervention from the monitor circuitry 310 or the control circuitry 320. The predefined threshold may be selected, for example, based on an expected rate of increase of the output voltage Vout, such that the predefined threshold is reached after the output voltage Vout has settled at its operating value as a result of the pre-conditioning of the node 322 by the control circuitry 320, to ensure that pre-conditioning of the node 322 continues until the output voltage Vout has settled at its operating value.

During subsequent operation of the LDO circuitry 300 (i.e. after start-up, when the output voltage Vout has settled to its operating value), a reduction in the magnitude of the supply voltage Vsup (which may arise, for example, as a result of other circuitry of a host device that incorporates the LDO circuitry 300 being switched on) may cause a reduction in the output voltage Vout, which will necessitate a compensating increase in the bias voltage applied to the control terminal of the output device 120 in order to maintain the output voltage Vout at its operating value.

Without intervention by the monitor circuitry 310 and the control circuitry 320, the feedback arrangement of the LDO circuitry 300 would cause the voltage output by the amplifier circuitry 110 to increase, thereby providing the required compensating increase in the bias voltage at the control terminal of the output device 120.

However, as in the LDO circuitry 200, it may be desirable for the LDO circuitry 300 to respond more quickly than the minimum response time to a reduction in the supply voltage Vsup.

Thus, in operation of the LDO circuitry 300, the control circuitry 320 may be operative to apply a voltage to the node 322, based on a characteristic of the supply voltage Vsup (as determined by the monitor circuitry 310), to pre-condition the control terminal of the output device 120 in order to reduce the response time of LDO circuitry 300 to a reduction in the supply voltage Vsup.

The monitor circuitry 310 in this example is configured to monitor the magnitude of the output voltage Vout, and to output a monitor output signal to the control circuitry 320 when the magnitude of the output voltage Vout falls by a predefined amount. The control circuitry 320 is configured to output a voltage to the node 322, in response to the monitor output signal, to increase the bias voltage at the control terminal of the output device 120, thus reducing the magnitude of an increase in the bias voltage required from the output of the amplifier circuitry 110 in order to restore the output voltage Vout to its operating value following the reduction in the magnitude of the supply voltage Vsup.

In some examples the voltage applied to the node 322 by the control circuitry 320 may be equal to the change in the bias voltage required to restore the output voltage Vout to its operating value after the reduction in the magnitude of the supply voltage Vsup. In other examples the voltage applied to the node 322 may be less than, but close to, the change in the bias voltage required to restore the output voltage Vout to its operating value after the reduction in the magnitude of the supply voltage Vsup.

Pre-conditioning the control terminal of the output device 120 by directly applying a voltage to increase the bias voltage in this way thus reduces the response time of the LDO circuitry 300 to the change in the supply voltage Vsup (i.e. the time taken for the output voltage Vout of the LDO circuitry 300 to return to its operating value following the change in the magnitude of the supply voltage Vsup), because the delay caused by the finite loop bandwidth of the feedback loop between the node 136 and the second input terminal of the amplifier circuitry 110 can be avoided or reduced, since directly raising the bias voltage at the control node of the output device 120 has the effect of reducing the difference between Vref and Vfbck.

Similarly, an increase in the magnitude of the supply voltage Vsup (which may arise, for example, as a result of other circuitry of a host device that incorporates the LDO circuitry 300 being switched off) during operation of the LDO circuitry 300 may cause an increase in the output voltage Vout, which will necessitate a compensating reduction in the bias voltage applied to the control terminal of the output device 120 in order to maintain the output voltage Vout at its operating value.

Without intervention by the monitor circuitry 310 and the control circuitry 320, the feedback arrangement of the LDO circuitry 300 would cause the voltage output by the amplifier circuitry 110 to decrease, thereby providing the required compensating reduction in the bias voltage at the control terminal of the output device 120.

However, as in the LDO circuitry 200, it may be desirable for the LDO circuitry 300 to respond more quickly than the minimum response time to an increase in the supply voltage Vsup.

Thus, in operation of the LDO circuitry 300, the control circuitry 320 may be operative to apply a negative voltage to the node 322, based on a characteristic of the supply voltage Vsup (as determined by the monitor circuitry 310), to pre-condition the control terminal of the output device 120 in order to reduce the response time of LDO circuitry 300 to an increase in the supply voltage Vsup.

The monitor circuitry 310 in this example is configured to monitor the magnitude of the supply voltage Vsup, and to output a monitor output signal to the control circuitry 320 when the magnitude of the supply voltage Vsup increases by a predefined amount. The control circuitry 320 is configured to output a voltage to the node 322, in response to the monitor output signal, to reduce the bias voltage at the control terminal of the output device 120, thus reducing the magnitude of a reduction in the bias voltage required from the output of the amplifier circuitry 110 in order to restore the output voltage Vout to its operating value following the increase in the magnitude of the supply voltage Vsup.

In some examples the negative voltage applied to the node 322 by the control circuitry 320 may be equal to the change in the bias voltage required to restore the output voltage Vout to its operating value after the increase in the magnitude of the supply voltage Vsup. In other examples the negative voltage applied to the node 322 may be less than, but close to, the change in the bias voltage required to restore the output voltage Vout to its operating value after the increase in the magnitude of the supply voltage Vsup.

Pre-conditioning the control terminal of the output device 120 by directly applying a voltage to reduce the bias voltage in this way thus reduces the response time of the LDO circuitry 300 to the change in the supply voltage Vsup (i.e. the time taken for the output voltage Vout of the LDO circuitry 300 to return to its operating value following the change in the magnitude of the supply voltage Vsup), because the delay caused by the finite loop bandwidth of the feedback loop between the node 136 and the second input terminal of the amplifier circuitry 110 can be avoided or reduced, since directly reducing the bias voltage at the control node of the output device 120 has the effect of reducing the difference between Vref and Vfbck.

Further, during operation of the LDO circuitry there may be fast transients in the output voltage Vout, e.g. as a result of transient changes in the current drawn by one or more loads coupled to the output node 170 of the LDO circuitry 300. Without intervention by the monitor circuitry 310 and the control circuitry 320, the response of the LDO circuitry 300 to such transients (which may be positive or negative) by providing a compensating adjustment to the bias voltage at the control terminal of the output device 120 to maintain the output voltage Vout at its operating value may not be fast enough.

Thus, the monitor circuitry 310 may be configured to monitor a rate of change of the output voltage Vout (i.e. dVout/dt) and to output a monitor output signal to the control circuitry 320 if the rate of change of the output voltage Vout meets a predetermined threshold. In response to the monitor output signal the control circuitry 320 applies a voltage to the node 322 to pre-condition the control terminal of the output device 120 by adjusting the bias voltage at the control node so as to compensate for the transient in the output voltage Vout.

As in the examples discussed above, pre-conditioning the control terminal of the output device 120 by directly applying a voltage to adjust the bias voltage in this way reduces the response time of the LDO circuitry 300 to the transient in the output voltage Vout (i.e. the time taken for the output voltage Vout of the LDO circuitry 300 to return to its operating value following the output voltage transient), because the delay caused by the finite loop bandwidth of the feedback loop between the node 136 and the second input terminal of the amplifier circuitry 110 can be avoided or reduced, since directly reducing the bias voltage at the control node of the output device 120 has the effect of reducing the difference between Vref and Vfbck.

Figure 4:
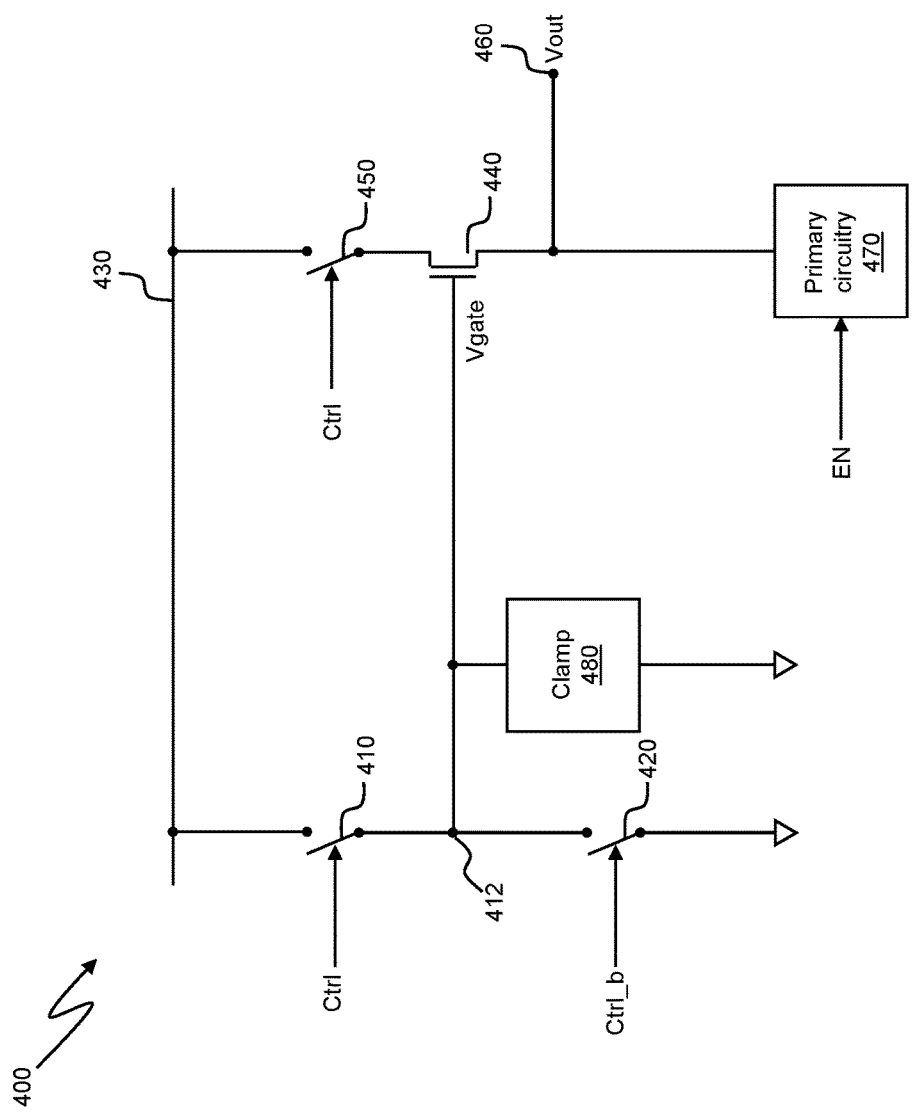
FIG. 4 is a schematic diagram illustrating pre-conditioning circuitry for pre-conditioning an output node.

FIG. 4 is a schematic diagram illustrating pre-conditioning circuitry for pre-conditioning an output node of primary circuitry such as LDO circuitry. The pre-conditioning circuitry, shown generally at 400 in FIG. 4, comprises first and second switches 410, 420 coupled in series between a supply voltage rail 430 and ground (or some other reference voltage). A node 412 between the first and second switches 410, 420 is coupled to a control terminal (e.g. a base terminal) of an output device 440, which may be, for example, a MOSFET device. A third switch 450 is coupled in series between the supply voltage rail 430 and a first terminal (e.g. a drain terminal) of the output device 440. An output node 460 of primary circuitry 470 (which may be LDO circuitry, for example) is coupled to a second terminal (e.g. a source terminal) of the output device 440. The circuitry 400 further comprises clamp circuitry 480 coupled in series between the node 412 and ground. The clamp circuitry 480 is configured to limit a voltage Vgate at the control terminal of the output device 440, and may comprise, for example, a plurality of series-connected diodes.

The first and third switches 410, 450 are controlled by a first control signal Ctrl, and the second switch 420 is controlled by a second control signal Ctrl_b. The second control signal Ctrl_b is complementary to the first control signal Ctrl, such that when Ctrl=0, Ctrl_b=1 and vice versa. The primary circuitry 470 is enabled or disabled according to a value of a primary circuitry control signal EN. In this example the primary circuitry is disabled when EN=0, and is enabled when EN=1.

In operation of the circuitry 400, either the first control signal Ctrl or the second control signal may be equal to the primary circuitry control signal.

In the case where EN=Ctrl, then when EN=0, Ctrl=0 and Ctrl_b=1. The primary circuitry 470 is disabled, the first and third switches 410, 450 are open and the second switch 420 is closed, such that the control terminal of the output device 120 is coupled to ground and the output device 120 is switched off. The voltage Vout at the output node 460 is thus 0 v.

When EN=1, Ctrl=1 and Ctrl_b=0. The primary circuitry 470 is enabled, and the first and third switches 410, 450 are closed. The output device 440 switches on, and the output voltage Vout increases over time to a value VCH, which is determined by the threshold voltage VTH of the output device and the clamp 480. While Vgate−Vout is greater than VTH, the output device 440 remains switched on. When Vgate−Vout falls below VTH, due to the increase in Vout, the output device 440 switches off.

Thus, when the primary circuitry 470 is enabled, Vout is initially driven by the pre-conditioning circuitry 400 to reach VCH quickly. Once the output device 440 has switched off, Vout is driven by the primary circuitry 470 and rises from VCH to a desired operating value. In this way the output voltage Vout can be driven to the desired operating value by the primary circuitry 470 more quickly than would be achieved without any intervention by the pre-conditioning circuitry 400, because the output node 460 has been pre-conditioned to VCH.

In the case where EN=Ctrl_b, then when EN=0, Ctrl_b=0 and Ctrl=1. Thus, when the primary circuitry 470 is disabled, the first and third switches 410, 450 are closed and Vout rises to VCH as described above. Thus when the primary circuitry 470 is disabled, the output node 460 is pre-conditioned to VCH.

When EN=0, Ctrl_b=1 and Ctrl=0. Thus, when the primary circuitry 400 is enabled after being disabled, the output voltage Vout is initially at VCH due to the pre-conditioning of the output node 460 that occurred while the primary circuitry 470 was disabled. The control terminal of the output device 440 is coupled to ground, thus switching the output device 440 off. The primary circuitry 470 then drives the output voltage Vout to the desired operating value, which is reached more quickly than would be achieved without any intervention by the pre-conditioning circuitry 400, because the output node 460 has been pre-conditioned to VCH.

Thus the pre-conditioning circuitry 400 enables the output node 460 to be directly pre-conditioned, both prior to enabling the primary circuitry 470 and on enabling the primary circuitry 470, to a voltage VCH that reduces the time required for the primary circuitry 470 to drive the output voltage to a desired operating value.

FIGS. 2 and 3 show examples of LDO circuitry that is able to pre-condition a node of the circuitry to support a change in the operation of the circuitry, e.g. a transition from inactive to active on start-up, or a change that is required to restore the LDO output voltage to its operating value following a change or transient in the LDO supply voltage or the LDO output voltage. It will be appreciated, however, that the principle of pre-conditioning a node of a circuit to improve a characteristic of the performance of the circuit (e.g. the response time, the power consumption or some other performance characteristic of the circuit) is equally applicable to other types of circuitry.

Figure 5:
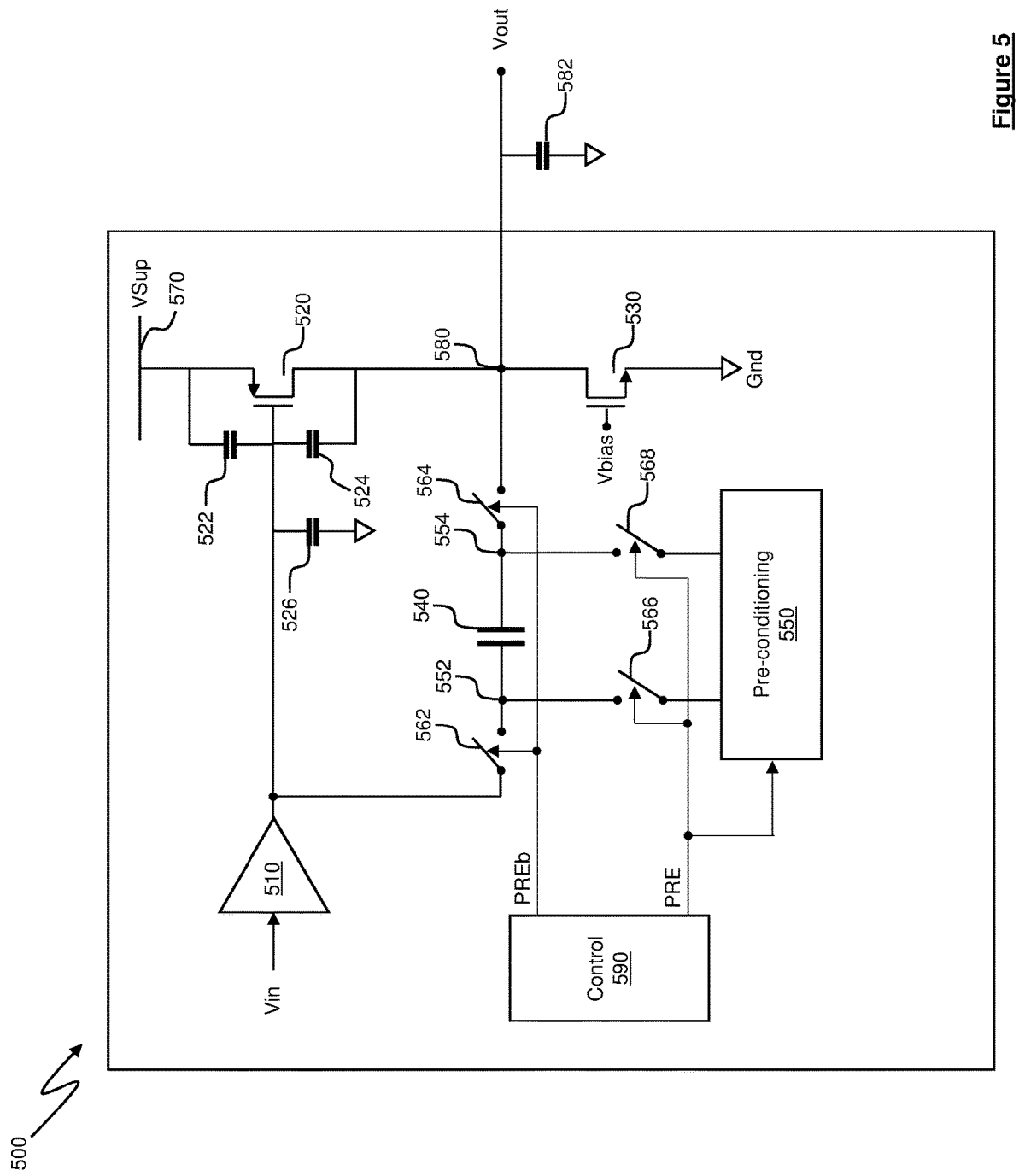
FIG. 5 is a schematic diagram illustrating amplifier circuitry including circuitry for pre-conditioning a node of the amplifier circuitry.

FIG. 5 is a schematic diagram illustrating amplifier circuitry including circuitry for pre-conditioning a node of the amplifier circuitry. The circuitry, shown generally at 500 in FIG. 5, includes an amplifier 510, an output device 520, a bias device 530, a miller capacitor 540 and pre-conditioning circuitry 550. The circuitry 500 further includes a switch network comprising first to fourth switches 562-568.

An output of the amplifier 510 is coupled to a control terminal (e.g. a gate terminal) of the output device 520, which may be, for example, a MOSFET device. A first (e.g.

drain) terminal of the output device 520 is coupled to a positive power supply rail 570 that provides a positive power supply voltage Vsup. A second (e.g. source) terminal of the output device is coupled to an output node 580 of the circuitry 500.

The bias device 530, which may be, for example, MOSFET device, receives a bias voltage Vbias at a control terminal (e.g. a gate terminal) thereof. A first (e.g. drain) terminal of the bias device 530 is coupled to the output node 580, and a second (e.g. source) terminal of the bias device is coupled to ground or some other reference voltage.

The miller capacitor 540 is coupled in series between the first and second switches 562, 564. The first switch 562 is also coupled to the output of the amplifier 510, and the second switch 564 is coupled to the output node 580. Thus, when the first and second switches 562, 564 are closed the Miller capacitor 540 is coupled between the output of the amplifier 510 and the output node 580.

The third switch 566 is coupled between a first output of the pre-conditioning circuitry 550 and a first node 552 that is coupled to a first terminal of the miller capacitor 540. The fourth switch 528 is coupled between a second output of the pre-conditioning circuitry 550 and a node 554 that is coupled to a second terminal of the miller capacitor 540. Thus, when the second and third switches 466, 468 are closed the miller capacitor 540 is coupled between the first and second outputs of the pre-conditioning circuitry 550.

The first and second switches 562, 564 are controlled by a first control signal PREb from control circuitry 590, and the third and fourth switches 566, 568 are controlled by a second control signal PRE from the control circuitry 590.

In normal operation of the circuitry 500, the first and second switches 562, 564 are closed, such that the miller capacitor 540 is coupled between the output of the amplifier circuitry 510 and the output node 580. An input signal is received at an input of the amplifier circuitry 510, and an amplifier output signal is received at the control terminal of the output device 520. An output signal Vout at the output node 580 follows the amplifier output signal, and the miller capacitor 540 provides frequency compensation for the amplifier circuitry 500.

As will be appreciated, on start-up of the circuitry 500 there will be a delay before the circuitry 500 reaches its steady state operating conditions, due to the time required for the miller capacitor 540 to charge up. In some applications it may be desirable for this settling time to be reduced.

To this end, the first and second nodes 552, 554 can be pre-conditioned so as to charge the miller capacitor 540 prior to operation of the circuitry 500. The control circuitry 590 outputs the first control signal PREb to open the first and second switches 562, 564, thereby decoupling the miller capacitor 540 from the amplifier circuitry 510 and the output node. The control circuitry 590 outputs the second control signal PRE to close the third and fourth switches 566, 568, thereby coupling the first and second nodes 552, 554 to the first and second outputs, respectively, of the pre-conditioning circuitry 550. The pre-conditioning circuitry 550 outputs a first voltage to the first node 552 and a second voltage to the second node 554 to charge the miller capacitor 540.

Once the miller capacitor 540 has been charged (e.g. to a predefined level, as determined by the pre-conditioning circuitry 550), the control circuitry 590 issues appropriate control signals PRE, PREb to open the third and fourth switches 566, 568, and to close the first and second switches 562, 564.

Normal operation of the circuitry 500 can now commence, with reduced settling time, because the miller capacitor 540 is already charged.

Pre-conditioning of the first and second nodes 552, 554 to charge the miller capacitor 540 may take into account parasitic capacitances in the circuitry 500. For example, a first parasitic capacitance 522 may exist between the drain and gate terminals of the output device 520. A second parasitic capacitance 524 may exist between the gate and source terminals of the output device, and there may be a third parasitic capacitance 526 associated with the gate terminal of the output device (represented in FIG. 5 by the capacitor 526 between the gate terminal and ground). A fourth parasitic capacitance 582 may be associated with the output node 580 (represented in FIG. 5 by the capacitor 582 between the output node 580 and ground). When the first and second switches 562, 564 are closed following pre-conditioning of the nodes 552, 554 to charge the miller capacitor 540, the charge on the miller capacitor 540 will be redistributed to the parasitic capacitances 522-526 and 582, thus reducing the level of charge on the miller capacitor 540. To compensate for this charge redistribution, the pre-conditioning circuitry 550 may apply the first and second voltages to charge the miller capacitor 540 to a level of charge that is higher than is theoretically required to achieve a desired reduction in the setting time of the circuitry. For example, if a desired settling time requires the miller capacitor 540 to be charged to a level C1, then the pre-conditioning circuitry 550 may charge the miller capacitor 540 to a level C1+ΔC, where ΔC is an additional amount of charge to compensate for charge redistribution to the parasitic capacitances 522-526 and 582.

Similar considerations apply to the circuitry 200 of FIG. 2 and the circuitry 300 of FIG. 3. As will be appreciated by those of ordinary skill in the art, there may be intrinsic (e.g. parasitic) or explicit (e.g. decoupling or bypass capacitances) in the circuitry 200, 300. The effects of such capacitances should be compensated for when pre-conditioning a node, e.g. by applying a voltage that is greater than is theoretically required to achieve a desired effect from the pre-conditioning.

For example, the output device 120 may have associated parasitic capacitances, e.g. between its drain and gate and between its gate and source. To compensate for the effect of such parasitic capacitances, the voltage applied when pre-conditioning the nodes 222, 322 may be greater than is theoretically required to achieve a desired settling time or response time of the circuitry 200, 300.

In the example of FIG. 5, a miller capacitor 540 is charged by pre-conditioning the nodes 552, 554 to improve the settling time of the circuitry 500. As will be appreciated by those of ordinary skill in the art, the principle of pre-conditioning one or more nodes of a circuit in order to pre-charge a capacitor to support a change in operation of the circuit is equally applicable to capacitors that are used for other purposes in other circuits.

In the example circuitry 200, 300, 400, 500 discussed above, the nodes 222, 322, 460, 552, 554 are pre-conditioned by applying a voltage directly to them. However, it will be appreciated that in other circuitry, pre-conditioning of one or more circuit nodes to improve the performance of the circuitry, e.g. by reducing a settling time or response time, reducing power consumption or the like, may be achieved by applying a current to the node(s) or by applying charge to the node(s).

In some implementations look-ahead circuitry may be provided to detect a trigger condition that will cause or necessitate a change in operation of circuitry. For example, look-ahead circuitry may be provided to detect a forthcoming reduction in a supply voltage to LDO circuitry (e.g. the LDO circuitry 200, 300 of FIG. 2 or 3) caused by, for example, activation of other circuitry that receives a supply voltage from the same supply (e.g. a battery) as the LDO circuitry. The pre-conditioning circuitry may apply the voltage, current or charge to the node of the circuitry in response to the detection of the trigger condition to pre-condition the node to support the change in operation of the circuitry.

Embodiments may be implemented as an integrated circuit which in some examples could be a codec or audio DSP or similar. Embodiments may be incorporated in an electronic device, which may for example be a portable device and/or a device operable with battery power. The device could be a communication device such as a mobile telephone or smartphone or similar. The device could be a computing device such as a notebook, laptop or tablet computing device. The device could be a wearable device such as a smartwatch. The device could be a device with voice control or activation functionality such as a smart speaker. In some instances the device could be an accessory device such as a headset, headphones, earphones, earbuds or the like to be used with some other product.

The skilled person will recognise that some aspects of the above-described apparatus and methods, for example the discovery and configuration methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array).

Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. Pre-conditioning circuitry for pre-conditioning a capacitor of a circuit to support a change in operation of the circuit, wherein the pre-conditioning circuitry is configured to apply a voltage, current or charge directly to the capacitor prior to the change in operation of the circuit to reduce a settling time of the circuit following the change in operation of the circuit, wherein the pre-conditioning circuitry is configured to output a first voltage to a first circuit node and to output a second voltage to a second circuit node to pre-charge the capacitor prior to the change in operation of the circuit.

2. The pre-conditioning circuitry of claim 1, wherein the pre-conditioning circuitry is configured to apply the voltage, current or charge directly to the capacitor to pre-charge the capacitor to a predefined level of charge prior to the change in operation of the circuit.

3. The pre-conditioning circuitry of claim 1, wherein the pre-conditioning circuitry is configured to control a first pre-conditioning switch to selectively output the first voltage to the first circuit node and to control a second pre-conditioning switch to selectively output the second voltage to the second circuit node.

4. The pre-conditioning circuitry of claim 2, wherein the predefined level of charge is higher than is theoretically required to achieve a given settling time.

5. The pre-conditioning circuitry of claim 4, wherein the predefined level of charge includes an additional amount of charge to compensate for charge redistribution from the capacitor to a parasitic capacitance, an intrinsic capacitance or an explicit capacitance of the circuit.

6. The pre-conditioning circuitry of claim 1, wherein the capacitor is a Miller capacitor.

7. The pre-conditioning circuitry of claim 1, wherein the circuit is an amplifier circuit configured such that, in use of the amplifier circuit, the capacitor provides frequency compensation for the amplifier circuit.

8. Pre-conditioning circuitry according to claim 1, wherein the change in operation of the circuit is in response to start-up of the circuit.

9. An integrated circuit comprising pre-conditioning circuitry according to claim 1.

10. A host device comprising pre-conditioning circuitry according to claim 1.

11. A host device according to claim 10, wherein the host device comprises a laptop, notebook, netbook or tablet computer, a gaming device, a games console, a controller for a games console, a virtual reality (VR) or augmented reality (AR) device, a mobile telephone, a portable audio player, a portable device, an accessory device for use with a laptop, notebook, netbook or tablet computer, a gaming device, a games console a VR or AR device, a mobile telephone, a portable audio player or other portable device.

\* \* \* \* \*